United States Patent
Imae et al.

(10) Patent No.: US 7,647,032 B2
(45) Date of Patent: Jan. 12, 2010

(54) OSCILLATION CONTROL DEVICE AND SYNCHRONIZATION SYSTEM

(75) Inventors: Michito Imae, Tsukuba (JP); Tomonari Suzuyama, Tsukuba (JP); Yasuhisa Fujii, Tsukuba (JP); Yoshinobu Kasumi, Musashino (JP); Eiji Ogita, Musashino (JP); Toshiaki Kawakami, Musashino (JP)

(73) Assignees: National Institute of Advanced Industrial Science and Technology, Tokyo (JP); Yokogawa Electric Corporation, Tokyo (JP)

(*) Notice: Subject to any disclaimer, the term of this patent is extended or adjusted under 35 U.S.C. 154(b) by 473 days.

(21) Appl. No.: 11/541,634

(22) Filed: Oct. 3, 2006

(65) Prior Publication Data
US 2007/0077902 A1 Apr. 5, 2007

(30) Foreign Application Priority Data
Oct. 4, 2005 (JP) ............................. 2005-290869

(51) Int. Cl.
*H04B 1/16* (2006.01)
*H04B 1/06* (2006.01)
(52) U.S. Cl. ..................... 455/208; 455/226.1; 455/265
(58) Field of Classification Search ................. 455/208, 455/205, 130, 265, 502, 13.2, 67.11, 226.1, 455/423, 3.02, 427, 12.1; 702/85, 89; 340/870.01, 340/870.04
See application file for complete search history.

(56) References Cited

U.S. PATENT DOCUMENTS

| 4,607,257 A | * | 8/1986 | Noguchi ................ 340/825.69 |
| 4,901,368 A | * | 2/1990 | Arnold et al. .............. 455/12.1 |
| 7,130,752 B2 | * | 10/2006 | Yoshida et al. ................ 702/85 |

FOREIGN PATENT DOCUMENTS

JP 2004-326671 A 11/2004

OTHER PUBLICATIONS

Michael A. Lombardi, Instrumentation and Measurement Technology Conference, 1999. IMTC/99. Proceedings of the 16th IEEE Publication Date: 1999; vol. 2, On pp. 618-622 vol. 2.*
SYMMETRICOM, "58503B GPS Time and Frequency Reference Receiver".

* cited by examiner

*Primary Examiner*—Sonny Trinh
(74) *Attorney, Agent, or Firm*—Sughrue Mion, PLLC

(57) ABSTRACT

An oscillation control device for controlling a frequency of an oscillator located at the remote site from a standard laboratory having a standard oscillator. The control device includes: a comparison section to compare a frequency of the frequency signal synchronized with a radio signal produced by a signal processing section with a frequency of a oscillation signal outputted from an oscillator to be controlled, an acquisition section to obtain, through a communication network, a comparison result which is obtained by a comparison of a frequency of the standard oscillator held by the standard laboratory and a frequency of the radio signal, a calculation section to calculate deviation between the frequency of the oscillator to be controlled and the frequency of the standard oscillator based on their comparison, and a control section to control the frequency of the oscillator to be controlled, based on the deviation calculated.

17 Claims, 3 Drawing Sheets

OSCILLATION CONTROL DEVICE AND SYNCHRONIZATION SYSTEM

CROSS-REFERENCE TO RELATED APPLICATION

The present U.S. patent application claims a priority under the Paris Convention of Japanese patent application No. 2005-290869 filed on Oct. 4, 2005, and shall be a basis of correction of an incorrect translation.

BACKGROUND OF THE INVENTION

1. Field of the Invention

The present invention relates to an oscillation control device for controlling the frequency of an oscillator and to a synchronization system for synchronizing the frequency of the oscillator with the frequency of an oscillator located at a remote site.

2. Description of Related Art

In earlier developments, there is a remote calibration system in which a reference value for enabling the precision measurement for a measurement instrument is supplied from a remote site (See JP-2004-326671A: Document 1). "Calibration" in the remote calibration system means a series of operations for defining the relationship between the value indicated by an instrument or a measurement system or the value represented by a material measure or by a reference material and the values realized by the standards.

As an example, in the remote calibration system, the difference between the frequency b of an oscillator under calibration which is located at a site B and the frequency f of the GPS signal transmitted from a GPS (Global Positioning System) satellite (i.e. b−f) is measured, and at the same measurement time, the difference between the reference frequency a of the reference oscillator (e.g. a standard oscillator of the National Metrology Institute) located at the site A and the frequency f of the GPS signal transmitted from the GPS satellite (i.e. a−f) is measured. Then, the difference between the data obtained by both measurements, that is, {(b−f)−(a−f)=(b−a)} is obtained through the communication network such as the Internet. As this difference frequency (b−a) represents the deviation of the frequency b of the oscillator under calibration from the reference frequency a of the reference oscillator, the oscillator located at the site B comes to be calibrated.

In Data Sheet "58503B GPS Time and Frequency Reference Receiver", by Symmetricom company: Document 2, an oscillator which is capable of synchronizing with the GPS signal has been proposed. FIG. 3 shows the principal part of the arrangement of an oscillator 200 shown in the Document 2. In the oscillator 200, a signal synchronizing with the GPS time (hereinafter called "synchronized signal") is produced when the GPS signal is received by a GPS receiving antenna 201, and is outputted to a frequency control section 203. In the frequency control section 203, the frequencies of the synchronized signal inputted thereto and of the oscillation signal outputted from a frequency oscillation section 204 (i.e. the oscillation signal of the oscillator 200) are compared with each other, and feedback is applied to the frequency oscillation section 204 so that the difference between both frequencies will be zero. In this manner and operation, the oscillation frequency of the oscillator 200 can be synchronized with the GPS time.

In the remote calibration system disclosed in Document 1, the frequency of the oscillator under calibration, which is located at the site B remote from the site A where the reference oscillator is located, still includes a deviation from the frequency of the national standard. Therefore, in the case that other measurement instruments are calibrated or adjusted by using the frequency of the oscillator at the site B, it is required to do based on the calibration certificate sent from the National Metrology Institute (any form of the certificate, including mailed document or electronically converted data sent through the communication network). As it usually takes several days to several weeks in order to get the calibration certificate, this system has a drawback in which such calibration or adjustment can not be performed in real time.

On the other hand, in the oscillator disclosed in Document 2, the frequency equivalent to the accurate frequency provided by the GPS satellite can be obtained in real time. However, because there exists a deviation between the frequency obtained from the GPS and the frequency provided by the standard oscillator of the National Metrology Institute and the scale thereof is not measured, the traceability can not be secured. In order to secure the traceability, it would be necessary to implement either the method similar to one that is disclosed in the Document 1 or to carry on (or to transport) the oscillator to the National Metrology Institute.

As mentioned above, a conventional oscillator has a drawback in which it cannot synchronize its own frequency in real time with the frequency of the standard oscillator located at the remote site.

SUMMARY OF THE INVENTION

An object of the present invention is to provide a device and a system, both of which enables the frequency of an oscillator remote from the location of the standard oscillator of the Standard Laboratory to synchronize in real time with the frequency of the standard oscillator.

In order to achieve the above object, in accordance with a first aspect of the invention, the oscillation control device for controlling a frequency of an oscillator located at the remote site from a predetermined standard laboratory having a high-accuracy standard oscillator, comprises:

a signal processing section to produce a frequency signal synchronized with a radio signal of which communication specification is made open to the public and which is transmitted from a predetermined site and is receivable at a plurality of sites, a comparison section to compare a frequency of the frequency signal produced by the signal processing section with a frequency of a oscillation signal outputted from an oscillator to be controlled, an acquisition section to obtain, through a communication network, a comparison result which is obtained by a comparison of a frequency of the standard oscillator held by the standard laboratory and a frequency of the radio signal, a calculation section to calculate, based on the comparison result obtained by the acquisition section and the comparison result by the comparison section, deviation between the frequency of the oscillator to be controlled and the frequency of the standard oscillator, and a control section to control the frequency of the oscillator to be controlled, based on the deviation calculated by the calculation section.

Preferably, the control section controls the frequency of the oscillator to make the deviation zero.

The radio signal may be a signal transmitted from a positioning satellites and the signal processing section may produce a frequency signal synchronized with the positioning signal contained in the radio signal.

Preferably, the positioning satellites are GPS satellites, and the signal processing section produces a frequency signal synchronized with GPS time.

The radio signal may be a standard radio wave containing a time information, and the signal processing section may produce the frequency signal synchronized with the time signal contained in the radio signal.

The radio signal may be a signal of which communication specification is opened to the public, and the signal processing section may produce a frequency signal synchronized with a signal which is contained in the radio signal and is synchronized with a reference frequency of a transmitter.

The standard laboratory may be the National Metrology Institute.

In accordance with a second aspect of the invention, the synchronizing system is for synchronizing a frequency of the oscillator located at the remote site from the standard laboratory with the frequency of the standard oscillator held by the standard laboratory by utilizing the oscillation control device as claimed in any one of claims 1-8, wherein the standard laboratory comprises:

a producing section to produce a frequency signal synchronized with the radio signal, based on the radio signal, a frequency comparison section to compare the frequency of the radio signal and a frequency of an oscillation signal outputted from the standard oscillator, a memory section for storing the comparison result data obtained by the frequency comparison section, a transmitting section to transmit the comparison result data stored in the memory section to the oscillation control device through a communication network, in response to the access from the oscillation control device to the memory section.

According to the invention, the frequency of an oscillator remote from the location of the standard oscillator of the standard laboratory can be synchronized in real time with the frequency of that standard oscillator.

In particular, as the standard laboratory is the National Metrology Institute, it becomes possible to secure the traceability with the National Standard by obtaining the frequency synchronized in real time with the National Standard. Therefore, it will be possible to increase convenience of the control and operation of the oscillator.

BRIEF DESCRIPTION OF THE DRAWINGS

The present invention will become more fully understood from the detailed description given hereinafter and the accompanying drawings which are given by way of illustration only, and thus are not intended as a definition of the limits of the scope of the invention, and wherein.

DETAILED DESCRIPTION OF THE PREFERRED EMBODIMENTS

Figure 1:
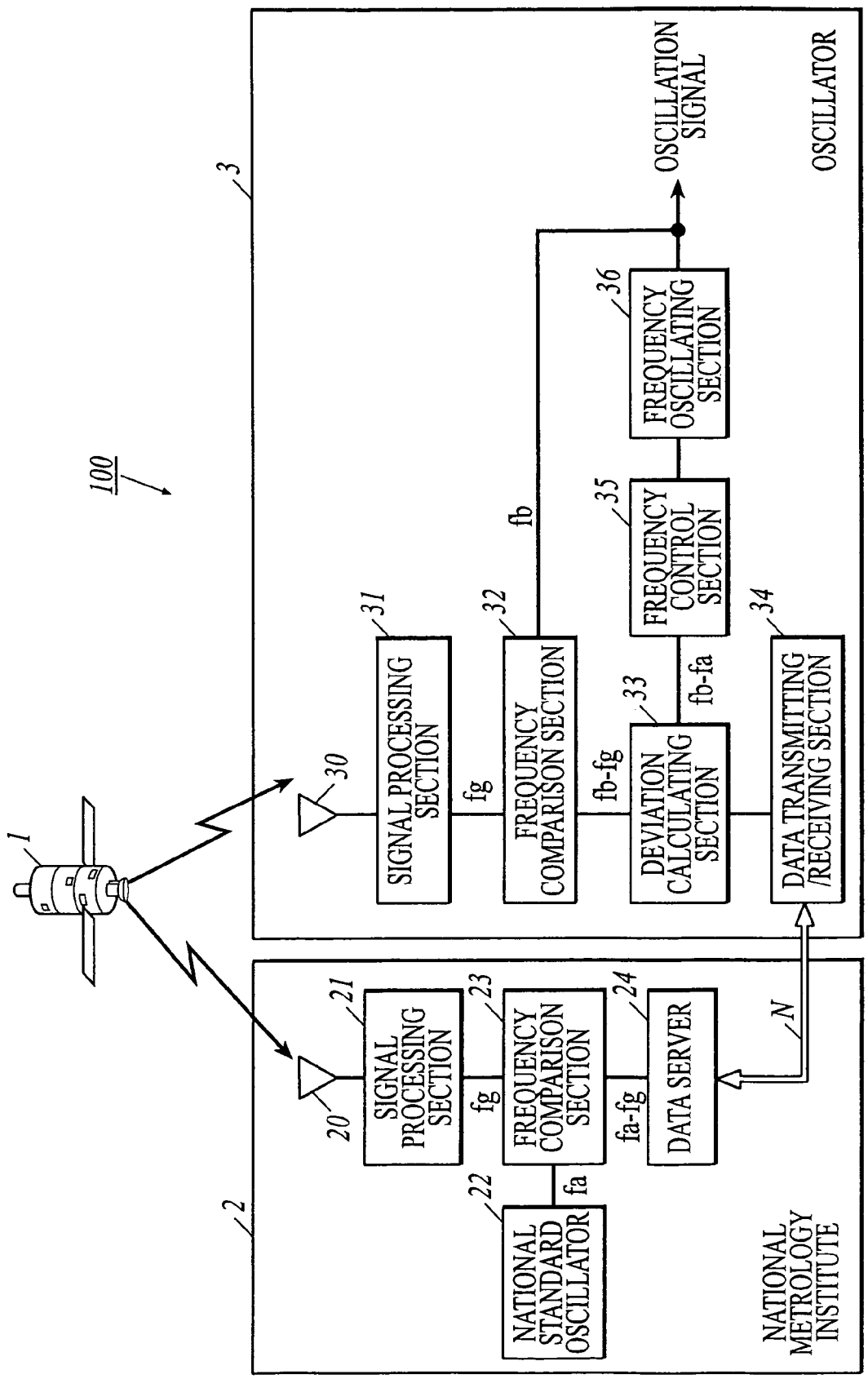
FIG. 1 is a schematic block diagram showing an embodiment according to the present invention, showing a synchronization system arrangement according to an embodiment of the invention, an internal arrangement constituting the synchronizing system of the National Metrology Institute, and an arrangement of a principal part of an oscillator remote from the National Metrology Institute.

Referring to the drawings attached herewith, the invention will be described hereinafter in connection with the preferred embodiment. In the explanation of the embodiment, the National Metrology Institute is used as a standard laboratory that holds and operates a high-accuracy standard oscillator and the national standard oscillator is used as a standard oscillator. Hereinafter, a "high-accuracy standard oscillator" means an oscillator which has accuracy as the standard for those oscillators used by other lower standard laboratory or users. Also, for the purpose of explaining the embodiment, the GPS (Global Positioning System) signal transmitted from GPS satellites is used as a "radio signal transmitted from a predetermined point (site) and receivable at a plurality of points (sites)".

FIG. 1 shows an arrangement of a synchronizing system 100 according to an embodiment of the invention. As shown in FIG. 1, the synchronization system 100 is comprised of a GPS satellite 1, the National Metrology Institute 2, and an oscillator 3 remotely located from the National Metrology Institute. The National Metrology Institute and the oscillator 3 are connected through a communication network N, such as the Internet.

Various oscillators including a highly-accurate oscillator usually used at the Measurement Standard Department or Measurement Management Department of a manufacturing company or a calibration laboratory, a frequency oscillator such as a crystal oscillator incorporated in a counter or a function generator, or a frequency oscillator which is an oscillation source of a clock can be used as the oscillator 3 adapted in the present embodiment.

As shown in FIG. 1, the National Metrology Institute 2 comprises a GPS receiving antenna 20, a signal processing section 21, a national standard oscillator 22, a frequency comparison section 23, and a data server 24. Incidentally, the signal processing section 21 corresponds to a producing section according to the present invention. The operation of respective sections constituting the National Metrology Institute 2 will be explained hereinafter.

The receiving antenna 20 receives the GPS signal from GPS satellites and outputs it to the signal processing section 21. The signal processing section 21 produces a signal (frequency signal) with a frequency fg synchronized with GPS time, which is outputted to the frequency comparison section 23. At the frequency comparison section 23, (fa−fg) is calculated by comparing the frequency fg of the signal outputted from the signal processing section 21, i.e. the frequency fg synchoronized with GPS Time, with the frequency fa of the oscillation signal outputted from the national standard oscillator 22. This comparison result or data (fa−fg) is outputted to the data server 24. The data is stored in a memory section (not shown) incorporated in the data server 24. When the oscillator 3 access to the data server 24 through the communication network N, the comparison result or the data (fa−fg) stored in the memory section will be transmitted to the oscillator 3 through a transmitting section (not shown) of the data server 24.

As shown in FIG. 1, the oscillator 3 comprises a GPS antenna 30, a signal processing section 31, a frequency comparison section 32, a deviation calculation section 33, a data transmitting/receiving section 34, a frequency control section 35, and a frequency oscillation section 36. The oscillation control device according to the present invention is constituted by the constitution parts, except for the frequency oscillator 36, of the oscillator 3. The frequency comparison section 32 corresponds to a comparison section according to the present invention, the deviation calculation section 33 corresponds to a calculation section according to the present invention, and the data transmitting/receiving section 34 corresponds to an acquisition section according to the present invention, the frequency control section 35 corresponds to a control section according to the present invention.

At the same time instant when the comparison process is performed for the frequency of the national standard oscillator 22 and that of the GPS signal, the oscillator 3 will perform the following process for the same GPS signal. The schedule as to what time the frequency comparison process should be done and which satellite signal should be compared is predetermined by the Bureau International des Poids et Mesures (BIPM). Therefore, the frequency comparison process in the embodiment is done in accordance with the schedule decided by the BIPM. Such schedule data is stored in a schedule memory section (not shown) of the National Metrology Institute 2 and a schedule memory section (not shown) of the oscillator 3, and the comparison process for the frequencies is done according to the schedule stored in the schedule memory sections.

The receiving antenna 30 receives the GPS signal from GPS satellite and outputs it to the signal processing section 31. The signal processing section 31 produces a signal (frequency signal) with a frequency fg synchronized with GPS time, which is outputted to the frequency comparison section 32. At the frequency comparison section 32, the frequency fb of an oscillation signal (oscillation signal of the oscillator 3) outputted from the frequency oscillation section 36 and the frequency synchronized with GPS Time fg are compared with each other, and (fb−fg) is calculated. The comparison result or data (fb−fg) is outputted to the deviation calculation section 33.

The data transmitting/receiving section 34 accesses to the data server 24 of the National Metrology Institute 2 through the communication network N, downloads the comparison result or data (fa−fg) obtained at the same time instant when the comparison process is performed in the oscillator 3, to output the data to the deviation calculation section 33.

In the deviation calculation section 33, the deviation between the frequency fb of the oscillation signal from the frequency oscillation section 36 and the frequency fa of the national standard oscillator 22 {(fb−fg)−(fa−fg)}=(fb−fa) is calculated based on the comparison result (fb−fg) inputted from the frequency comparison section 32 and the comparison result (fa−fg) downloaded from the National Metrology Institute 2. The calculated deviation data (fb−fa) is outputted to the frequency control section 35.

The frequency control section 35 adjusts (i.e., controls) the frequency of the frequency oscillation section 36 so that the deviation (fb−fa) inputted from the deviation calculation section 33 will be zero.

By the above-mentioned operations, the frequency fb of the oscillation signal of the oscillator 3 is synchronized with the frequency of the national standard oscillator 22 and, hence, the oscillator 3 will come to have the value and accuracy corresponding to those of the national standard.

As described above, it is possible, according to the synchronization system 100 embodied herein, to make the frequency of an oscillator located at the site remote to the location of the standard oscillator synchronize with the frequency of the standard oscillator in real time. In particular, as the National Metrology Institute 2 is selected as a standard laboratory, it is possible to obtain the frequency that is synchronized with the output frequency of the national standard oscillator 22 in real time. Accordingly, adjustment of the oscillator in real time, which could not be realized by the conventional remote calibration system, becomes possible and securement of the traceability, which also the conventional oscillator incorporating a GPS receiving function could not realize, becomes possible. In this manner, as the synchronization system according to the invention can assure the accuracy equivalent to that of the national standard and traceability in real time, it will increase the convenience of the control and operation of the oscillator 3.

It should be noted that the above description made in connection with the preferred embodiment may be modified or varied without departing the scope and spirit of the invention.

For instance, in the above-described embodiment, while the GPS signal is adapted as one example of "the radio signal of which communication specification is opened to the public and which is receivable at a plurality of sites", the radio signal is not limited to the GPS signal, and other signals can be utilized. It would be possible to produce the frequency synchronized with the positioning signal at the signal processing sections 21 and 31 by receiving the radio signal from the positioning satellite, such as the Galileo satellite. It also would be possible to produce the frequency signal synchronized with the time signal contained in the radio signal at the signal processing sections 21 and 31 by receiving the standard radio signal containing a time information, e.g., JJY or the like.

Furthermore, as the radio signal, the radio signal of which communication specification is made open to the public (naturally, the frequency of the signal transmitted from the transmitter is known to the public) can be utilized. For example, if the information on the communication specification of such radio signal, such as "the radio signal contains a pulse signal and the frequency of this pulse signal is one sixteenth (1/16) of the frequency (the reference frequency) of the reference oscillator provided in the transmitter which transmits the radio signal" is opened to the public, it would be possible for a receiving side to obtain the reference signal of the transmitter by detecting that pulse signal and multiplying the frequency thereof by 16. In this case, the frequency signal synchronized with the pulse signal (which is synchronized with the radio signal) contained in the radio signal is produced at the signal processing sections 21 and 31.

Figure 2:
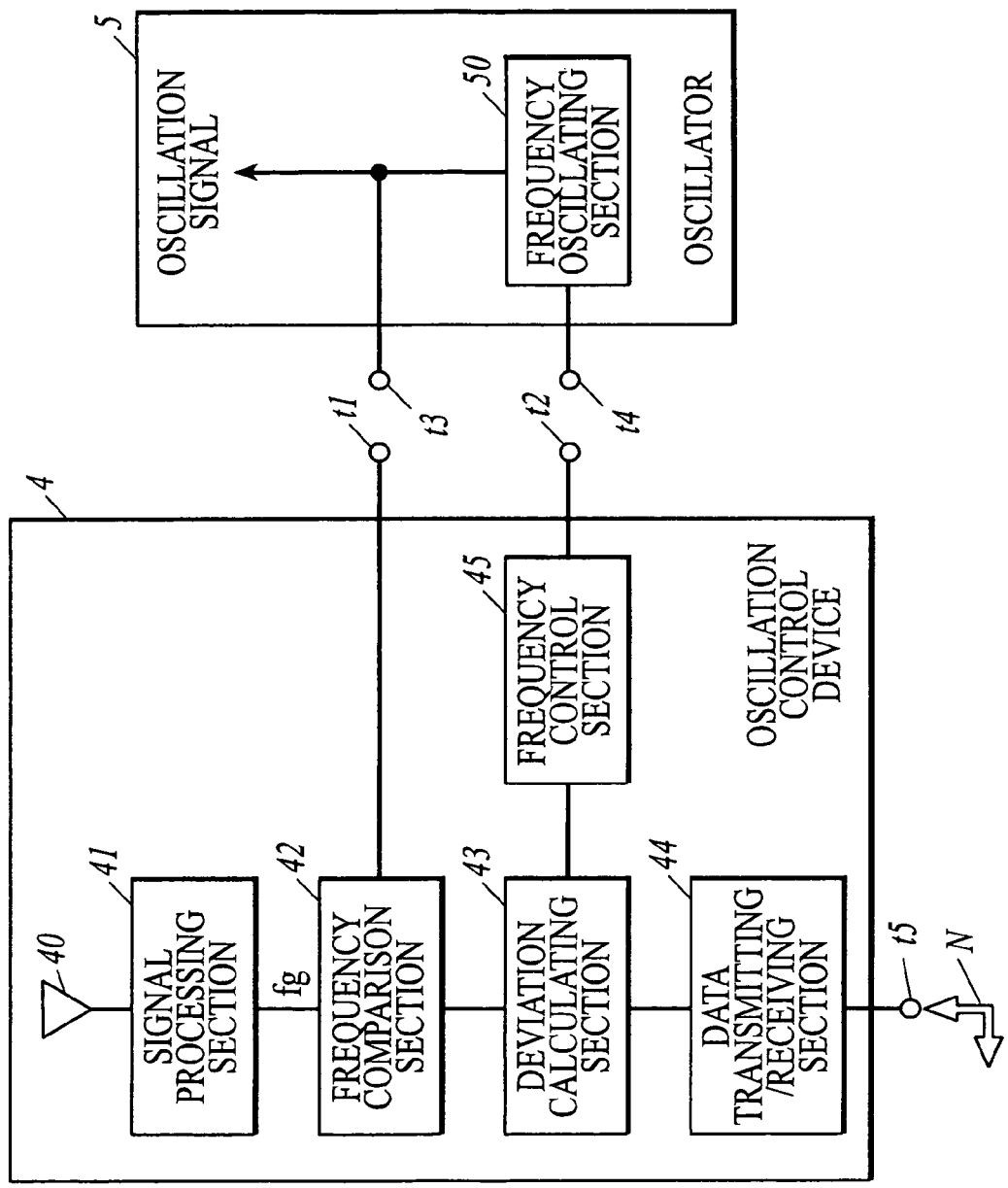
FIG. 2 is a schematic block diagram showing an arrangement of the main part of an oscillation control device which can control the frequency of the existing oscillator.
Figure 3:
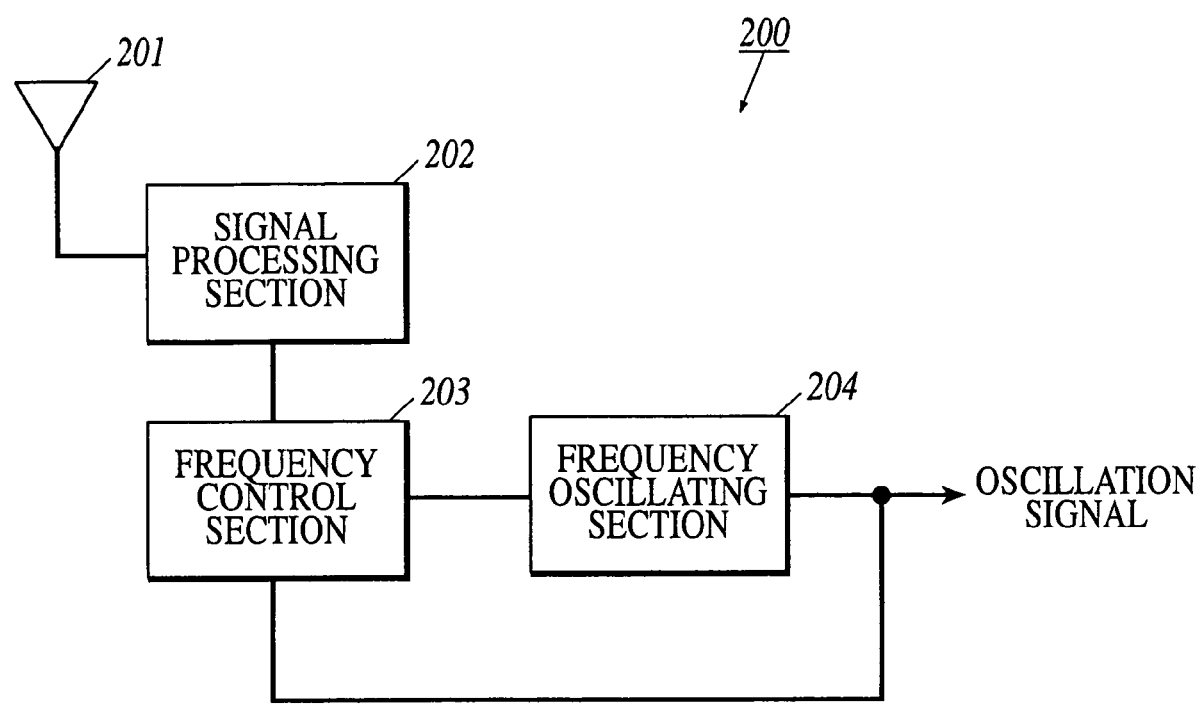
FIG. 3 is a schematic block diagram showing an arrangement of the main part of a conventional oscillator.

Furthermore, in the above-described embodiment as shown in FIG. 1, while the oscillator 3 is shown as the integration of the frequency oscillation section 36 and a part to control the output frequency of the frequency oscillation section, it would be possible to arrange the oscillator, as shown in FIG. 2, by making an existing oscillator 5 connectable to the oscillation control device 4 which controls the output frequency of the oscillator 5.

The oscillation control device 4 comprises, as shown in FIG. 2, the GPS receiving antenna 40, the signal processing section 41, the frequency comparison section 42, the deviation calculation section 43, the data transmitting/receiving section 44 and the frequency control section 45. The functions of the respective sections are equivalent to those of the sections shown in FIG. 1, that is, GPS receiving antenna 30, the signal processing section 31, the frequency comparison section 32, the deviation calculation 33, the data transmitting/receiving section 34 and the frequency control section 35.

An oscillation signal input terminal t1 which inputs the oscillation signal outputted from the frequency oscillation section 50 of the oscillator 5 is connected to the frequency comparison section 42. The control signal output terminal t2 which outputs the control signal to the oscillator 5 is connected to the frequency control section 45. A comparison data input terminal t5 for obtaining the comparison result (fa−fg) from the National Metrology Institute 2 through the communication network N is connected to the data transmitting/receiving section 44 is connected. An oscillation signal output terminal t3 for outputting the oscillation signal to the oscillation control device 4 and a control signal input terminal t4 for inputting the control signal from the oscillation control device 4 are connected to the frequency oscillation section 50 of the oscillator 5. The oscillation control device 4 is, for example, a card type device and can be connectably inserted into the main body of the oscillator 5 through the terminals t1 to t4. With such arrangement as described above, a user of the oscillator can chose, if needed, whether or not the frequency of the oscillator 5 should be synchronized with the output frequency of the standard oscillator at remote location from where the oscillator 5 is located. If it needs to synchronize the frequency of the oscillator 5 with the frequency of the standard oscillator located at the remote site, the comparison result (fa−fg) will be obtained by connecting the comparison result input terminal t5 to the communication network N.

In the system using the oscillation control device 4 and the existing oscillator 5, as shown in FIG. 1 or FIG. 2, it would be possible to obtain a calibration certificate from the standard laboratory, if needed, by transmitting the data (fb−fg) (i.e., the difference between the frequency fb of the oscillator 5 and the frequency fg synchronized with GPS Time) to the standard laboratory from the data transmitting/receiving section 44. In this case, if the National Metrology Institute is selected as a standard laboratory, the system can be synchronized with the national standard oscillator and the calibration certificate will be obtainable from the National Metrology Institute thereby enabling the verification of the traceability with the national standard.

What is claimed is:

1. An oscillation control device for controlling a frequency of an oscillator located at the remote site from a predetermined standard laboratory having a high-accuracy standard oscillator, comprising:
   a signal processing section to produce a frequency signal synchronized with a radio signal of which communication specification is made open to the public and which is transmitted from a predetermined site and is receivable at a plurality of sites,
   a comparison section to compare a frequency of the frequency signal produced by the signal processing section with a frequency of a oscillation signal outputted from an oscillator to be controlled,
   an acquisition section to obtain, through a communication network, a comparison result which is obtained by a comparison of a frequency of the standard oscillator held by the standard laboratory and a frequency of the radio signal,
   a calculation section to calculate, based on the comparison result obtained by the acquisition section and the comparison result by the comparison section, deviation between the frequency of the oscillator to be controlled and the frequency of the standard oscillator, and
   a control section to control the frequency of the oscillator to be controlled, based on the deviation calculated by the calculation section.

2. The oscillation control device according to claim 1, wherein the control section controls the frequency of the oscillator to make the deviation zero.

3. A synchronizing system for synchronizing a frequency of the oscillator located at the remote site from where the standard laboratory is located with the frequency of the standard oscillator held by the standard laboratory by utilizing the oscillation control device as-claimed in claim 2, wherein the standard laboratory comprises:
   a producing section to produce a frequency signal synchronized with the radio signal, based on the radio signal,
   a frequency comparison section to compare the frequency of the radio signal and a frequency of an oscillation signal outputted from the standard oscillator,
   a memory section for storing the comparison result data obtained by the frequency comparison section,
   a transmitting section to transmit the comparison result data stored in the memory section to the oscillation control device through a communication network, in response to the access from the oscillation control device to the memory section.

4. The oscillation control device according to claim 1, wherein the radio signal is a signal transmitted from a positioning satellite and the signal processing section produces a frequency signal synchronized with the positioning signal contained in the radio signal.

5. The oscillation control device according to claim 4, wherein the positioning satellite is a GPS satellite, and the signal processing section produces a frequency signal synchronized with GPS Time.

6. A synchronizing system for synchronizing a frequency of the oscillator located at the remote site from where the standard laboratory is located with the frequency of the standard oscillator held by the standard laboratory by utilizing the oscillation control device as-claimed in claim 5, wherein the standard laboratory comprises:
   a producing section to produce a frequency signal synchronized with the radio signal, based on the radio signal,
   a frequency comparison section to compare the frequency of the radio signal and a frequency of an oscillation signal outputted from the standard oscillator,
   a memory section for storing the comparison result data obtained by the frequency comparison section,
   a transmitting section to transmit the comparison result data stored in the memory section to the oscillation control device through a communication network, in response to the access from the oscillation control device to the memory section.

7. A synchronizing system for synchronizing a frequency of the oscillator located at the remote site from where the standard laboratory is located with the frequency of the standard oscillator held by the standard laboratory by utilizing the oscillation control device as-claimed in claim 4, wherein the standard laboratory comprises:
   a producing section to produce a frequency signal synchronized with the radio signal, based on the radio signal,
   a frequency comparison section to compare the frequency of the radio signal and a frequency of an oscillation signal outputted from the standard oscillator,
   a memory section for storing the comparison result data obtained by the frequency comparison section,
   a transmitting section to transmit the comparison result data stored in the memory section to the oscillation control device through a communication network, in response to the access from the oscillation control device to the memory section.

8. The oscillation control device according to claim 1, the radio signal is a standard radio wave containing a time information, and the signal processing section produces the frequency signal synchronized with the time signal contained in the radio signal.

9. A synchronizing system for synchronizing a frequency of the oscillator located at the remote site from where the standard laboratory is located with the frequency of the standard oscillator held by the standard laboratory by utilizing the oscillation control device as-claimed in claim 8, wherein the standard laboratory comprises:
 a producing section to produce a frequency signal synchronized with the radio signal, based on the radio signal,
 a frequency comparison section to compare the frequency of the radio signal and a frequency of an oscillation signal outputted from the standard oscillator,
 a memory section for storing the comparison result data obtained by the frequency comparison section,
 a transmitting section to transmit the comparison result data stored in the memory section to the oscillation control device through a communication network, in response to the access from the oscillation control device to the memory section.

10. The oscillation control device according to claim 1, wherein the radio signal is a signal of which communication specification is opened to the public, and the signal processing section produces a frequency signal synchronized with a signal which is contained in the radio signal and is synchronized with a reference frequency of a transmitter.

11. A synchronizing system for synchronizing a frequency of the oscillator located at the remote site from where the standard laboratory is located with the frequency of the standard oscillator held by the standard laboratory by utilizing the oscillation control device as-claimed in claim 10, wherein the standard laboratory comprises:
 a producing section to produce a frequency signal synchronized with the radio signal, based on the radio signal,
 a frequency comparison section to compare the frequency of the radio signal and a frequency of an oscillation signal outputted from the standard oscillator,
 a memory section for storing the comparison result data obtained by the frequency comparison section,
 a transmitting section to transmit the comparison result data stored in the memory section to the oscillation control device through a communication network, in response to the access from the oscillation control device to the memory section.

12. The oscillation control device according to claim 1, wherein the standard laboratory is the National Metrology Institute.

13. A synchronizing system for synchronizing a frequency of the oscillator located at the remote site from where the standard laboratory is located with the frequency of the standard oscillator held by the standard laboratory by utilizing the oscillation control device as-claimed in claim 12, wherein the standard laboratory comprises:
 a producing section to produce a frequency signal synchronized with the radio signal, based on the radio signal,
 a frequency comparison section to compare the frequency of the radio signal and a frequency of an oscillation signal outputted from the standard oscillator,
 a memory section for storing the comparison result data obtained by the frequency comparison section,
 a transmitting section to transmit the comparison result data stored in the memory section to the oscillation control device through a communication network, in response to the access from the oscillation control device to the memory section.

14. A synchronizing system for synchronizing a frequency of the oscillator located at the remote site from where the standard laboratory is located with the frequency of the standard oscillator held by the standard laboratory by utilizing the oscillation control device as claimed in claim 1, wherein the standard laboratory comprises:
 a producing section to produce a frequency signal synchronized with the radio signal, based on the radio signal,
 a frequency comparison section to compare the frequency of the radio signal and a frequency of an oscillation signal outputted from the standard oscillator,
 a memory section for storing the comparison result data obtained by the frequency comparison section,
 a transmitting section to transmit the comparison result data stored in the memory section to the oscillation control device through a communication network, in response to the access from the oscillation control device to the memory section.

15. The oscillation control device according to claim 1, wherein the control section controls the frequency of the oscillator automatically.

16. The oscillation control device according to claim 1, wherein the control section controls the frequency of the oscillator directly.

17. The oscillation control device according to claim 1, wherein production of the frequency signal by the signal processing section, comparison by the comparison section, acquisition by the acquisition section, calculation by the calculation section, and control of the frequency of the oscillator by the control section occur contemporaneously.

* * * * *